(12) United States Patent
Park et al.

(10) Patent No.: US 7,005,735 B2
(45) Date of Patent: Feb. 28, 2006

(54) ARRAY PRINTED CIRCUIT BOARD

(75) Inventors: Chang-Yong Park, Cheonan (KR);
Byung-Man Kim, Cheonan0 (KR);
Jong-Soo Choi, Seoul (KR);
Kwang-Ho Chun, Asan (KR);
Se-Hyung Ryu, Cheonan (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 15 days.

(21) Appl. No.: 10/775,070

(22) Filed: Feb. 11, 2004

(65) Prior Publication Data

US 2004/0238932 A1    Dec. 2, 2004

(30) Foreign Application Priority Data

Feb. 11, 2003  (KR) ...................... 10-2003-0008449

(51) Int. Cl.
*H01L 23/02* (2006.01)
(52) U.S. Cl. ...................................... 257/686; 257/724
(58) Field of Classification Search .............. 257/686, 257/724
See application file for complete search history.

(56) References Cited

U.S. PATENT DOCUMENTS

| | | | | |
|---|---|---|---|---|
| 4,733,461 A | * | 3/1988 | Nakano | ..................... 29/830 |
| 6,227,867 B1 | | 5/2001 | Chen et al. | |
| 6,307,769 B1 | * | 10/2001 | Nuxoll et al. | ................. 365/63 |

FOREIGN PATENT DOCUMENTS

| | | |
|---|---|---|
| JP | 09-223856 | 8/1997 |
| JP | 9223856 | 8/1997 |
| JP | 10-150295 | 6/1998 |

OTHER PUBLICATIONS

Korean Office Action, dated Jan. 24, 2005, with English translation.

* cited by examiner

*Primary Examiner*—Tu-Tu Ho
(74) *Attorney, Agent, or Firm*—Harness Dickey & Pierce P.L.C.

(57) ABSTRACT

The array printed circuit board includes at least one circuit board having a first surface. A first layout of first and second chip mounting regions is formed on a first half of the first surface and a second layout of first, and second chip mounting regions is formed on a second half of the first surface. The first and second layouts have opposite first and second chip mounting region patterns.

12 Claims, 5 Drawing Sheets

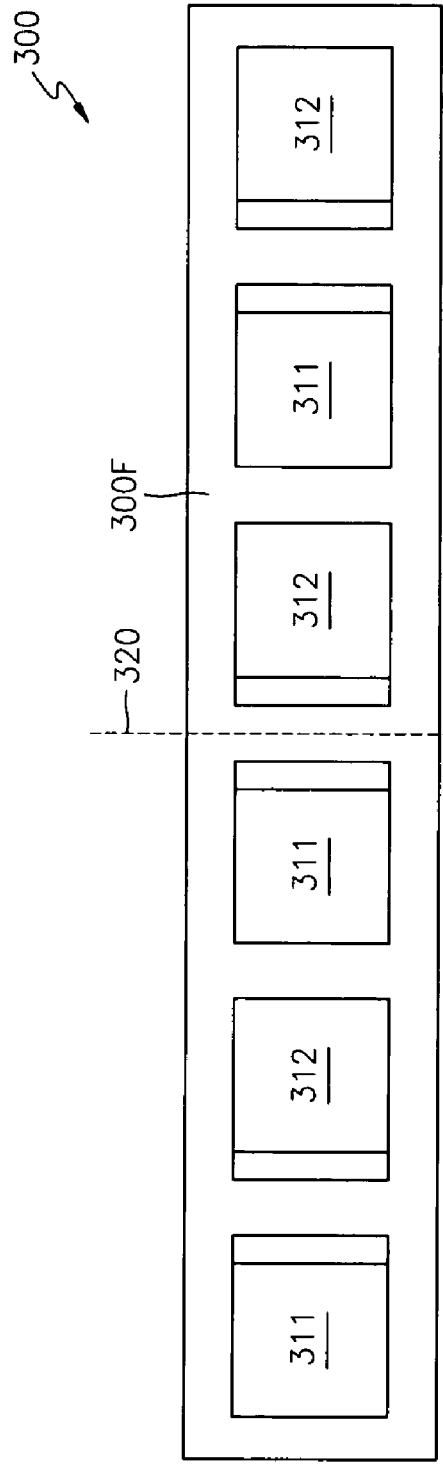
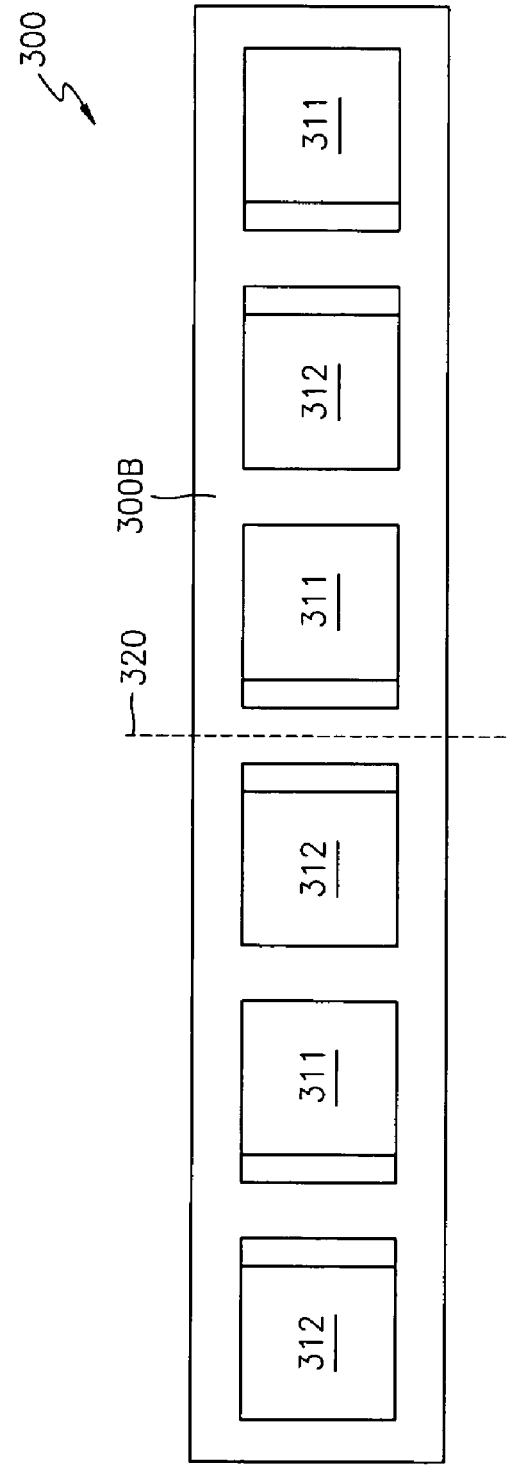

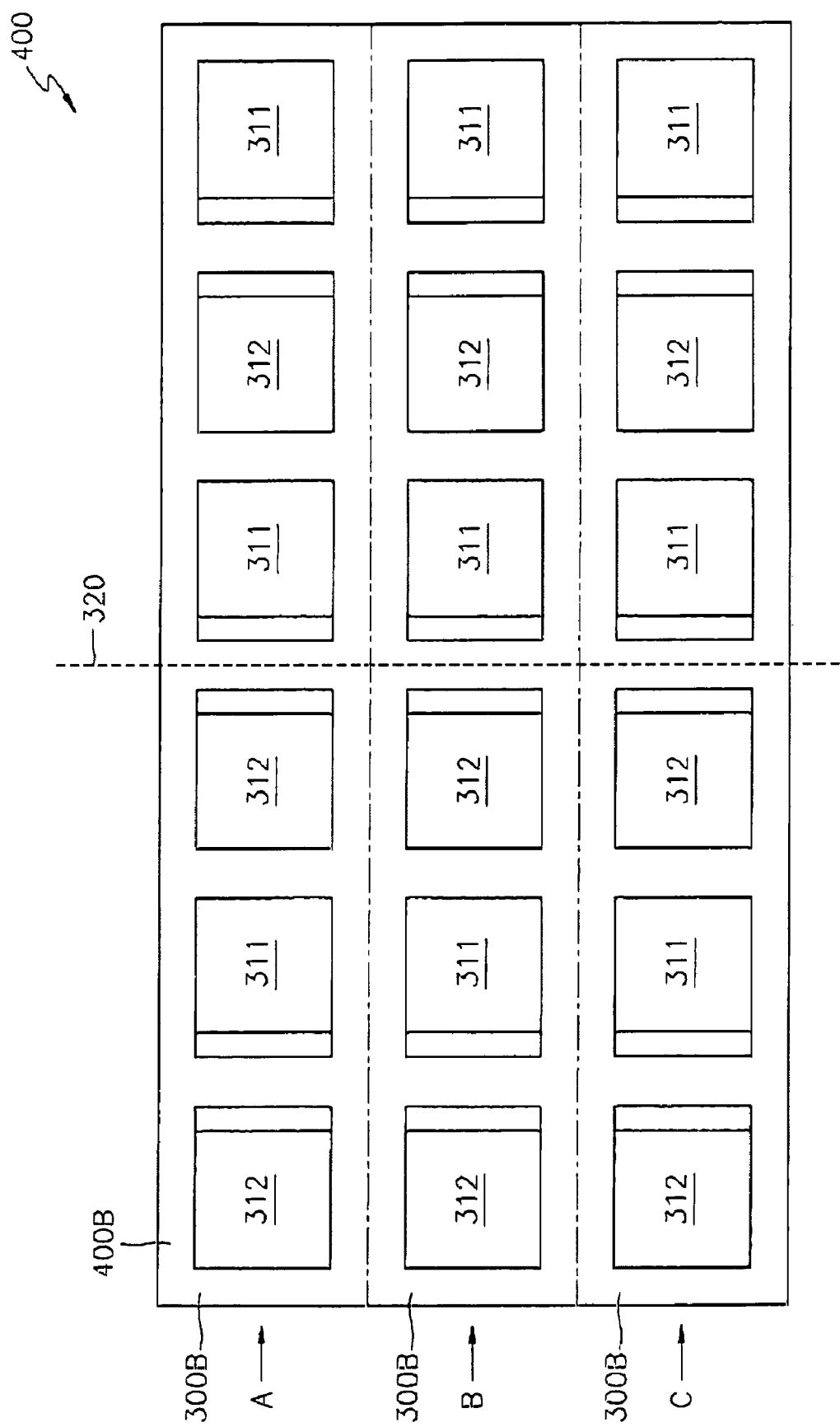

ARRAY PRINTED CIRCUIT BOARD

BACKGROUND OF THE INVENTION

This application claims the priority of Korean Patent Application No. 2003-8449, filed on Feb. 11, 2003, in the Korean Intellectual Property Office, the disclosure of which is incorporated herein in its entirety by reference.

1. Field of the Invention

The present invention relates to a printed circuit board which is often used during manufacture of a semiconductor package, and more particularly, to an array printed circuit board.

2. Description of the Related Art

An increase in the use of multimedia applications and the advancement in digital processing techniques have triggered an increase in demand for the manufacture of compact, large-capacity, low-power consumption, and multi-functional semiconductor package products, which are capable of processing a large amount of data at a high speed. To satisfy this demand, various kinds of semiconductor package products are often manufactured, but in small amounts. In particular, in order to improve productivity, there is a growing tendency to manufacture array printed circuit boards instead of single printed circuit boards. The array printed circuit board is made by packaging a plurality of single printed circuit boards together.

FIGS. 1 and 2 are front and rear views of a prior art array printed circuit board 100. Referring to FIGS. 1 and 2, a plurality of single printed circuit boards 110, 120, . . . are connected to make the array printed circuit board 100. The first single printed circuit board 110 has a front surface 111 and a rear surface 112. A plurality of front chip mounting regions 111a and a plurality of rear chip mounting regions 112a are disposed on the front surface 111 and the rear surface 112, respectively. The second single printed circuit board 120, which is connected in parallel to the first single printed circuit board 110, also has a front surface 121 and a rear surface 122. Likewise, a plurality of front chip mounting regions 121a and a plurality of rear chip mounting regions 122a are disposed on the front surface 121 and the rear surface 122, respectively. However, the layouts of the front chip mounting regions 111a and 121a are different from those of the rear chip mounting regions 112a and 122a.

Manufacture of a semiconductor package with the conventional array printed circuit board 100 requires a surface-mounting technique (SMT) process (hereinafter referred to as the 'SMT process') where semiconductor elements are mounted on the array printed circuit board 100. The SMT process is performed using surface-mounting equipment. The surface-mounting equipment includes unit apparatuses such as a screen printer, a lead application detector, a chip mounter, and a reflow apparatus. For example, U.S. Pat. No. 6,227,867 discloses a double-sided surface mounting process. However, with the prior art array printed circuit board 100, the SMT process is performed on the rear surfaces 112, 122, . . . after performing the SMT process on the front surfaces 111, 121, . . . . In this case, the layouts of the front surfaces 111, 121, . . . are different from those of the rear surfaces 112, 112, . . . , and thus, it is inconvenient to perform the SMT process on the prior art array printed circuit board 100. For example partial unit apparatuses of the surface-mounting equipment must be changed for each layout.

These inconveniences becomes more serious when manufacturing a multi-layer semiconductor package in which several semiconductor packages are arranged in a multi-layer structure so that they can act as one semiconductor package. In this case, the surface-mounting equipment must be changed between performing the SMT process on the front and rear surfaces of the respective semiconductor packages. Also, since the SMT process must be performed on each layer of the semiconductor package, the number of times the surface-mounting equipment is changed dramatically increases.

SUMMARY OF THE INVENTION

The array printed circuit board according to one embodiment of the present invention includes at least one circuit board having a first surface. A first layout of first and second chip mounting regions is formed on a first half of the first surface and a second layout of first and second chip mounting regions is formed on a second half of the first surface. In this embodiment, the first and second layouts have opposite first and second chip mounting region patterns.

In an exemplary embodiment, the first layout provides for alternating first and second chip mounting regions beginning with the first chip mounting region, and the second layout provides for alternating first and second chip mounting regions beginning with the second chip mounting region.

In an exemplary embodiment, the circuit board also has a second surface opposite the first surface. The second surface has a first half disposed under the first half of the first surface and a second half disposed under the second half of the first surface. The second layout is formed on the first half of the second surface and the first layout is formed on the second half of the second surface.

In a further exemplary embodiment of the present invention, the arrayed printed circuit board includes at least one circuit board having a front and rear surface. The front surface has a first pattern of first and second chip mounting regions, and the rear surface has a second pattern of first and second chip mount regions. Here, the second pattern is an opposite of the first pattern.

In an exemplary embodiment, the first pattern provides for alternating first and second chip mounting regions beginning with the first chip mounting region, and the second pattern provides for alternating first and second chip mounting regions beginning with the second chip mounting region.

With respect to the above described embodiments, a number of the circuit boards may be sequentially connected to one another in a direction perpendicular to a direction in which the first and second chip mounting regions arrayed on each circuit board.

Accordingly, in the array printed circuit board, the coordinates and arrangements of objects, which are mounted on the first and second surface, are similar to each other. Thus, if a semiconductor package is manufactured using the array printed circuit board, it is possible to reduce the number of times the surface-mounting equipment must be changed when performing the SMT process of mounting semiconductor chips on desired positions of the array printed circuit board. Accordingly, it is possible to expedite the SMT process and reduce manufacturing costs.

BRIEF DESCRIPTION OF THE DRAWINGS

The above and other aspects and advantages of the present invention will become more apparent by describing in detail exemplary embodiments thereof with reference to the attached drawings in which:

FIG. 3A is a front view of an array printed circuit board according to a first embodiment of the present invention;

FIG. 3B is a rear view of an array printed circuit board according to the first embodiment of the present invention;

FIG. 4B is a rear view of an array printed circuit board according to the second embodiment of the present invention.

DETAILED DESCRIPTION OF THE INVENTION

Hereinafter, exemplary embodiments of the present invention will be described in detail with reference to the accompanying drawings.

Figure 3C:
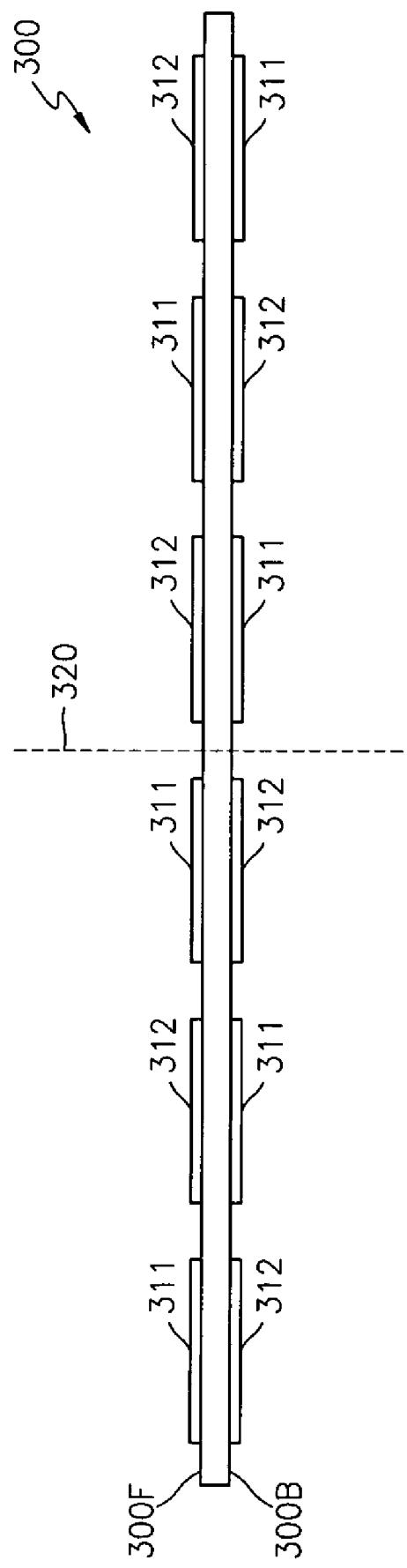
FIG. 3C is a side view of an array printed circuit board according to the first embodiment of the present invention.

FIGS. 3A and 3B are a front view and a rear view of an array printed circuit board 300 according to an embodiment of the present invention. FIG. 3C is a side view of the array printed circuit board 300 according to this embodiment of the present invention.

Figure 1:
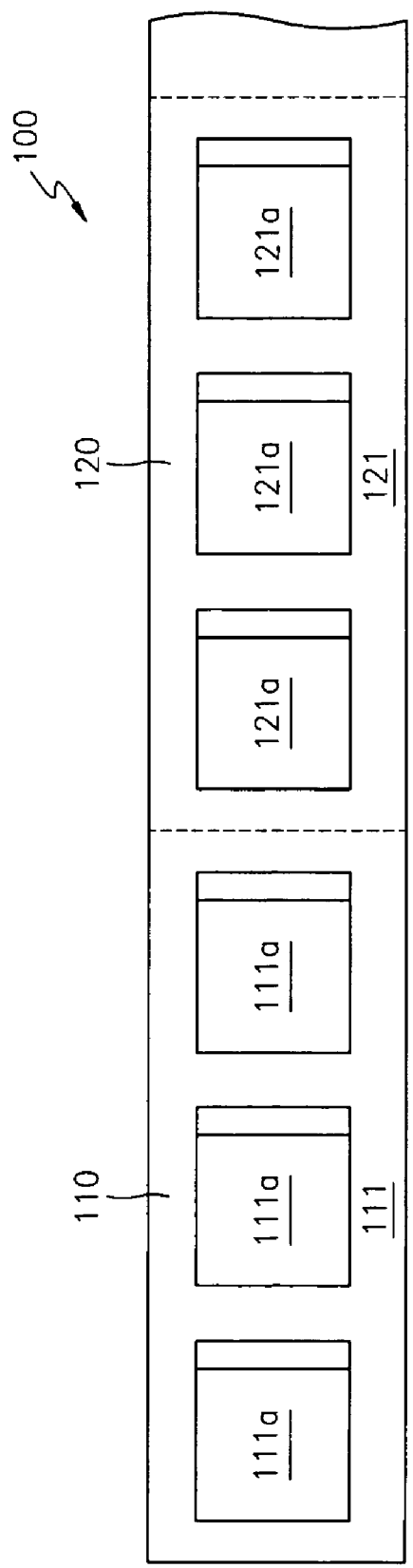
FIG. 1 is a front view of a prior art array printed circuit board.
Figure 2:
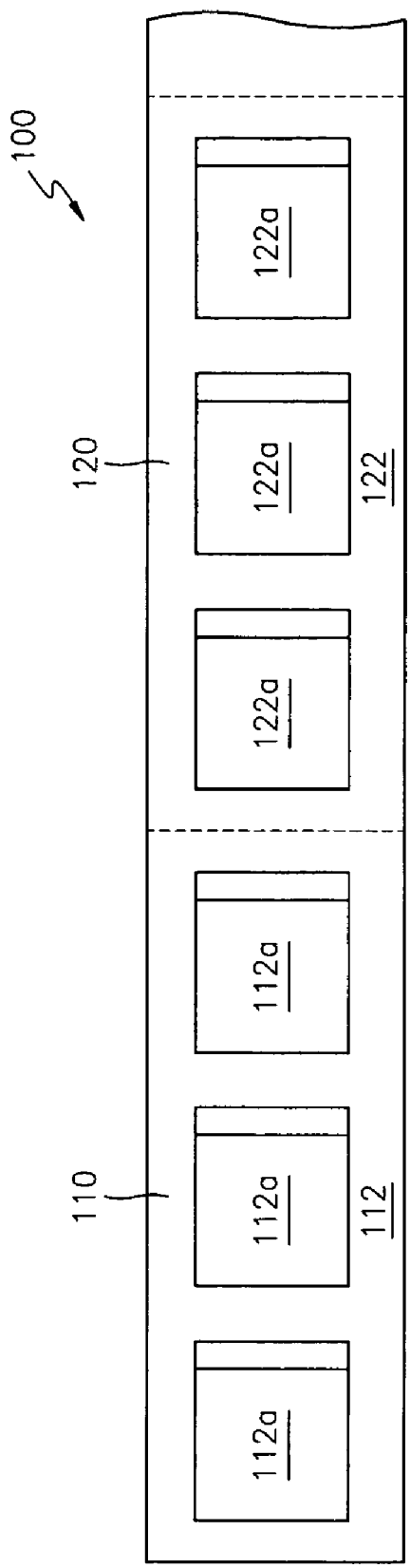
FIG. 2 is a rear view of a prior art array printed circuit board.

Referring to FIGS. 3A through 3C, a plurality of first and second chip mounting regions 311 and 312 are disposed at a front surface 300F and a rear surface 300B of the array printed circuit board 300. Here, the first chip mounting region 311 and the second chip mounting region 312 correspond to the front chip mounting region 111a and the rear chip mounting region 112a, respectively, of the prior art array printed circuit board 100 shown in FIGS. 1 and 2. Namely, the layout of the first chip mounting region 311 is different from that of the second chip mounting region 312.

Beginning at the leftmost portion of the front surface 300F of the array printed circuit board 300 a plurality of the first and second chip mounting regions 311 and 312 are alternately formed on the front surface 300F. In the example of FIG. 3A, three of the first chip mounting region 311 and three of the second chip mounting region 312 are formed on the front surface 300F; however, the present invention is not limited to these numbers.

Referring to FIG. 3A, a first layout of two first chip mount regions 311 and one second chip mounting region 312 is formed at a left side of the array printed circuit board 300 with respect to a dotted line 320, and a second layout of one first chip mounting region 311 and two second chip mounting regions 312 is formed at a right side of the array printed circuit board 300 with respect to a dotted line 320. Accordingly, the first and second layouts have opposite chip mounting patterns.

FIG. 3B shows that the rear surface 300B of the array printed circuit board 300 has the same second layout disposed under the first layout of the front surface 300F, and has the same first layout disposed under the second layout of the front surface 300F. Accordingly, the layout of the first chip mounting regions 311 on the front surface 300F is symmetrical with the layout of the second chip mounting regions 312 on the rear surface 300B, and the layout of the second chip mounting regions 312 is symmetrical with the layout of the first chip mounting regions 311 on the rear surface 300B.

Because of the chip mounting region symmetries between the front and rear surfaces 300F and 300B, the coordinates and arrangement of objects to be mounted on the front surface 300F of the array printed circuit board 300 are similar to those of objects to be mounted on the rear surface 300B, thereby reducing the number of times the surface-mounting equipment must be changed when performing the SMT process using the array printed circuit board 300. Accordingly, it is possible to expedite the SMT process and reduce manufacturing costs.

For convenience, FIGS. 3A and 3B illustrate three chip mounting regions 311 and 312 formed at the respective right and left sides of the front and rear surfaces 300F and 300B; however, the number of chip mounting regions is not limited to the above description.

Figure 4A:
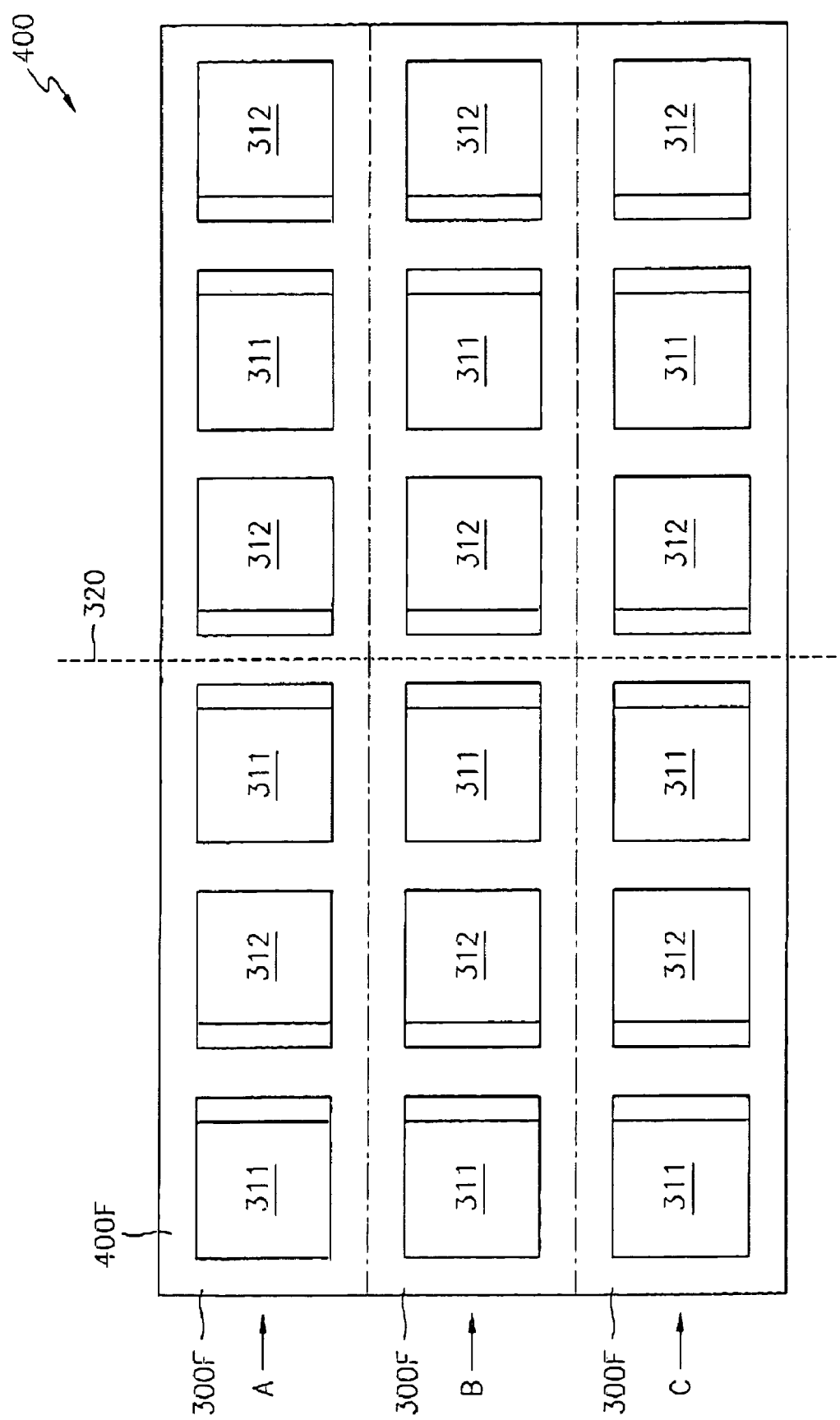
FIG. 4A is a front view of an array printed circuit board according to a second embodiment of the present invention.

FIGS. 4A and 4B are a front view and a rear view of an array printed circuit board 400 according to another embodiment of the present invention. The array printed circuit board 400 is used to manufacture a multi-layer semiconductor package. FIGS. 4A and 4B illustrate the specific example of an array printed circuit board 400 used to manufacture a three layer semiconductor package. As shown, a first-layer array printed circuit board A for a first layer of the semiconductor package, a second-layer array printed circuit board B for a second layer of the semiconductor package, and a third-layer array printed circuit board C for a third layer of the semiconductor package are sequentially connected to one another in a direction perpendicular to a direction in which the first and second chip mounting regions 311 and 312 arrayed on each circuit board.

Namely, the bottom of the first-layer array printed circuit board A is connected to the top of the second-layer array printed circuit board B, and the bottom of the second-layer array printed circuit board B is connected to the top of the third-layer array printed circuit board C. In FIGS. 4A and 4B, the array printed circuit board 400 for a three-layer semiconductor package is illustrated and described for convenience, but the number of layers of an array printed circuit board according to the present invention is not limited to this example.

As further shown in FIGS. 4A and 4B, each of the first, second and third-layer array printed circuit boards A, B and C has the same layout structure as the array printed circuit board 300 illustrated in FIGS. 3A–3C. Accordingly, the collection of front surfaces 300F of the first, second and third-layer array printed circuit boards A, B and C forms the front surface 400F of the array printed circuit board 400, and the collection of rear surfaces 300B the first, second and third-layer array printed circuit boards A, B and C forms the rear surface 400B of the array printed circuit board 400.

Accordingly, in the array printed circuit board 400, the coordinates and arrangements of objects, which are mounted on the front surface 400F and the rear surface 400B, are similar to each other. Thus, if a semiconductor package is manufactured using the array printed circuit board 400, it is possible to reduce the number of times the surface-mounting equipment must be changed when performing the SMT process of mounting semiconductor chips on desired positions of the array printed circuit board 400. Accordingly, it is possible to expedite the SMT process and reduce manufacturing costs.

While this invention has been particularly shown and described with reference to preferred embodiments thereof, it will be understood by those skilled in the art that various changes in form and details may be made therein without departing from the spirit and scope of the invention.

What is claimed is:

1. An array printed circuit board, comprising:
   a plurality of circuit boards including at least one circuit board having a first surface, a first layout of first and second chip mounting regions formed on a first half of the first surface and a second layout of first and second chip mounting regions formed on a second half of the first surface, the first and second layouts having opposite first and second chip mounting region patterns;

wherein the plurality of circuit boards are sequentially connected to one another in a direction perpendicular to a direction in which the first and second chip mounting regions are arrayed on each circuit board.

2. The array printed circuit board of claim 1, wherein the first layout provides for alternating first and second chip mounting regions beginning with the first chip mounting region and the second layout provides for alternating first and second chip mounting regions beginning with the second chip mounting region.

3. The array printed circuit board of claim 2, wherein the first and second chip mounting regions have different layouts.

4. The array printed circuit board of claim 1, wherein the first and second chip mounting regions have different layouts.

5. The array printed circuit board of claim 1, wherein at least one circuit board has a second surface opposite the first surface, the second surface has a first half disposed under the first half of the first surface and a second half disposed under the second half of the first surface, the second layout formed on the first half of the second surface and the first layout formed on the second half of the second surface.

6. The array printed circuit board of claim 5, wherein the first layout provides for alternating first and second chip mounting regions beginning with the first chip mounting region and the second layout provides for alternating first and second chip mounting regions beginning with the second chip mounting region.

7. The array printed circuit board of claim 6, wherein the first and second chip mounting regions have different layouts.

8. The array printed circuit board of claim 5, wherein the first and second chip mounting regions have different layouts.

9. An array printed circuit board, comprising:

a plurality of circuit boards including at least one circuit board having a front and rear surface, the front surface having a first pattern of first and second chip mounting regions and the rear surface having a second pattern of first and second chip mount regions, the second pattern being an opposite of the first pattern;

wherein the plurality of circuit boards are sequentially connected to one another in a direction perpendicular to a direction in which the first and second chip mounting regions are arrayed on each circuit board.

10. The array printed circuit board of claim 9, wherein the first pattern provides for alternating first and second chip mounting regions beginning with the first chip mounting region and the second pattern provides for alternating first and second chip mounting regions beginning with the second chip mounting region.

11. The array printed circuit board of claim 10, wherein the first and second chip mounting regions have different layouts.

12. The array printed circuit board of claim 9, wherein the first and second chip mounting regions have different layouts.

* * * * *